(12) United States Patent
Hassan

(10) Patent No.: US 7,028,396 B2
(45) Date of Patent: Apr. 18, 2006

(54) SEMICONDUCTOR CHIP PICK AND PLACE PROCESS AND EQUIPMENT

(75) Inventor: Iszharudin Hassan, Kuala Lumpur (MY)

(73) Assignee: Texas Instruments Incorporated, Dallas, TX (US)

(*) Notice: Subject to any disclaimer, the term of this patent is extended or adjusted under 35 U.S.C. 154(b) by 283 days.

(21) Appl. No.: 10/413,050

(22) Filed: Apr. 14, 2003

(65) Prior Publication Data

US 2004/0200064 A1    Oct. 14, 2004

(51) Int. Cl.
H05K 3/30    (2006.01)

(52) U.S. Cl. ............... 29/832; 29/426.1; 29/426.3; 29/426.5; 29/564.1; 29/840

(58) Field of Classification Search ............... 29/832, 29/840, 564.1, 564.6, 426.1, 426.3, 426.5
See application file for complete search history.

(56) References Cited

U.S. PATENT DOCUMENTS

| | | | | |
|---|---|---|---|---|
| 3,785,507 A | * | 1/1974 | Wiesler et al. ............... 29/700 |
| 4,476,626 A | * | 10/1984 | Gumbert et al. ............... 29/740 |
| 4,494,902 A | * | 1/1985 | Kuppens et al. ............... 221/74 |
| 4,829,663 A | * | 5/1989 | Masujima et al. ............... 29/840 |
| 4,850,780 A | * | 7/1989 | Safabakhsh et al. ...... 414/416.1 |
| 4,990,051 A | * | 2/1991 | Safabakhsh et al. ......... 156/344 |
| 6,190,115 B1 | * | 2/2001 | Suzuki et al. ............ 414/752.1 |
| 6,505,397 B1 | * | 1/2003 | Mimata et al. ............... 29/740 |

* cited by examiner

Primary Examiner—Carl J. Arbes
(74) Attorney, Agent, or Firm—Yingsheng Tung; Wade James Brady, III; Frederick J. Telecky, Jr.

(57) ABSTRACT

A process and tooling for removing a semiconductor chip (31) from a handling tape (321) without damage to either the chip or tape by one or more horizontal beam type ejector tools (333) driven by a variable speed motor (332) applying uniform pressure to the tape and chip backside. Each tool (333) emerges from a rigid support surface through an aperture which also serves to supply vacuum to hold the chip in alignment prior to ejection, and in turn allows planar removal of the chip by a pick-up arm (351).

13 Claims, 3 Drawing Sheets

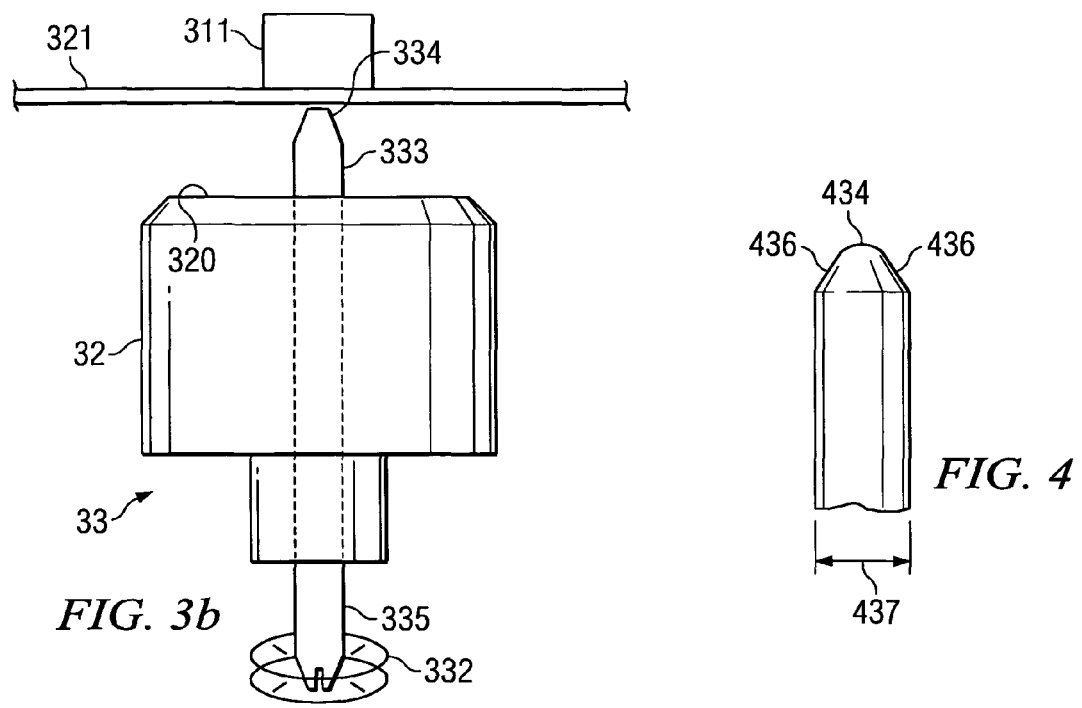
*FIG. 3b*
*FIG. 4*
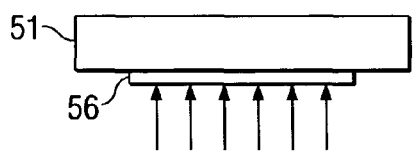
*FIG. 5a*
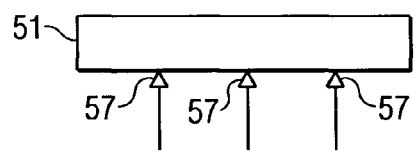
*FIG. 5b*
*(PRIOR ART)*
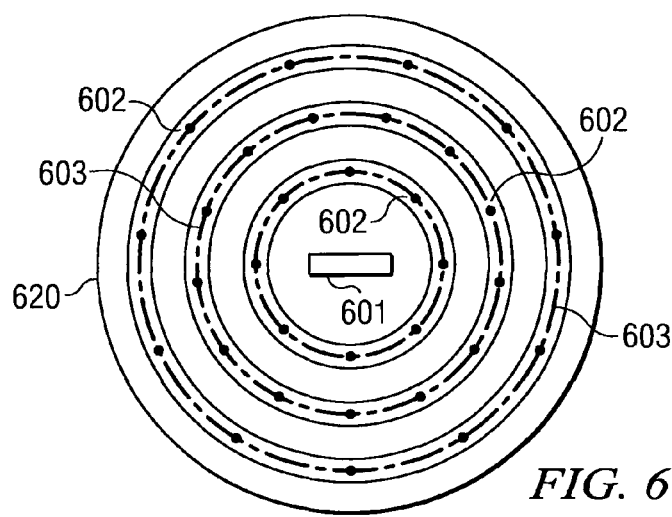
*FIG. 6*

SEMICONDUCTOR CHIP PICK AND PLACE PROCESS AND EQUIPMENT

FIELD OF THE INVENTION

The present invention relates to assembly of semiconductor devices, and more specifically to a method and tooling which facilitate removal of circuit chips from wafer handling tape.

BACKGROUND OF THE INVENTION

Conventional practice in the manufacture of circuit chips involves the fabrication of semiconductor wafers having an array of devices comprising individual circuit elements formed on one surface of the wafer. The wafers are separated into discrete circuit chips or die by a diamond saw or other dicing equipment after the wafer has been mounted onto a wafer handling tape. The wafer tape having an adhesive on one surface is affixed to a film frame. The tape and frame secure the wafer during dicing, and provide a transport support through the chip mount process. Individual chips are removed from the tape by an ejector assembly on the chip mount equipment, and are placed on a receiving pad of a lead frame or on a metal pattern formed on an insulating substrate. The lead frame and metal pattern are the electrical contact to the next level of interconnection in the packaging system.

As illustrated in FIG. 1, a typical chip mount apparatus includes an x/y moveable table 10, which supports the handling tape 121 and frame 12 onto which a wafer 11 diced into a plurality of individual chips 111 is positioned, an ejector assembly 13 including a rigid support surface 131 larger than the chip size, an ejector motor 132, and one or more ejector pins 133. In operation, the selected chip 111 is centered atop the support surface 131 and ejector assembly 13, vacuum is applied to the tape, and ejector pins 133 are activated to cause the chip 111 to be raised vertically from the tape. A pick-up arm 14 secures the freed chip 111 and places it onto an awaiting interconnect medium (not shown).

Each individual chip 111 is removed from the tape by ejector pins 133 pressing upward against the back side of the rigid chip on flexible tape 121 while the tape is pulled downward by suction applied through vacuum apertures in the support surface 131. The support surface 131 includes a plurality of grooves with vacuum apertures through which the tape is to be pulled against the surface when vacuum is applied to the tape through the apertures. The rigid, nearly flat surface of the support surface 131 is typically referred to as a "dome", as it will be hereafter in this disclosure.

As circuits have increased in complexity, chip sizes have increased and often wafer thickness has decreased, thus increasing sensitivity to various stress related defects. For almost all semiconductor devices speed and performance requirements have continuously become more demanding. Some semiconductor devices have a relatively small active circuit area, but the number of I/O (input/output) contacts is large, and in order to meet the speed and performance requirements, it is advantageous to position the bonding pads along the long sides of a high aspect ratio chip, allowing interconnect routing and bond wire lengths to be short. DRAM chips traditionally have high length to width ratios with leads and bonds predominately along the long axes, but more recently extremely high aspect ratio chips have been fabricated having a length to width ratio of about four or greater to one. Assembly of such devices without damage through dicing and pick and place processes presents a difficult challenge.

The ejector pin system for chip pick-up and place has been the source of a number of reliability and yield failures for many integrated circuit devices. The pins are sharp needle shaped devices which extend about 1 mm from the dome surface during ejection. The non-uniform contact between the pin and chip backside contributes to stress related defects on the chip backside as a result of mechanical contact by the ejector pins. Further, stresses from height variations of multi-needle ejectors, defective ejector pins, as well as tape or adhesive contamination on the chip from the sharp pointed or defective needles cause circuit failures. Stress related issues may result not only in cracked die, but also in latent defects detected only after thermal exposure during assembly or operation. Contamination from tape or adhesive being transferred to the chip backside may manifest itself as an uneven stress on the chip after assembly, or as a form of contamination contributing to corrosion or leakage. Yield losses may occur from damaged chips, or chips poorly placed on a receiving pad as a result of non-planar or tilted pick-up.

Small chips are ejected from the tape by a single needle, but large chips and high aspect ratio chips are typically pushed from the tape by multiple needles which are intended to distribute the stress load. However, it is time consuming and costly to hold precise tolerances between multiple tip heights, and during operation the sharp tips become damaged, resulting in height variation.

FIG. 2 provides a side view of an arrangement with three ejector pins 233 and 234 pushing a rectangular chip 211 from the handling tape 221. It can be seen in this illustration that the pins 233 and 234 are not at the same elevation. Specifically, the tip of the center pin 234 is extended further from the ejector dome 231 than the side pins 233, thereby allowing a stress concentration on the chip center which may result in a crack 212. In another example a needle placed at the end of a row may be lower than the others causing pick-up to be non-planar and result in misplacement of the chip on its receiving pad.

A need exists in the semiconductor industry for a process whereby large or high aspect ratio chips can be transferred from a handling tape precisely and without damaging the chip.

SUMMARY OF THE INVENTION

In accordance with a first embodiment of the invention, a process for removing an individual semiconductor chip from an adhesive coated handling tape without damage to either the chip or tape is facilitated by an improved ejector assembly. The ejector assembly includes one or more horizontal beam type ejectors which have a rounded top surface, a dome having a rigid support surface with multiple apertures through which vacuum is applied to secure the tape and chip, as well as openings through which the ejectors protrude when activated by a variable rate motor. In order to complete the pick and place process, an arm having a vacuum tip to remove the ejected chip is provided.

The process includes aligning a selected chip on the ejector assembly dome, holding the tape and chip securely by vacuum supplied through one or more openings in the dome, actuating the motor to drive the ejector tools vertically upward, and uniformly pressing the chip upward from the transport tape so that it can be removed by a vacuum tip on the arm. The assembly facilitates vertical, planar pick-up and accurate placement on a receiving pad as a result of uniform pressure applied across much of the chip backside.

The process has technical and reliability advantages for assembly of high aspect ratio, large rectangular, and square chips which have been removed from a transport tape and are free of stress related cracks, tape contamination, and other defects which have previously plagued the assembly process.

In accordance with another embodiment of the invention, an improved ejector assembly is provided. The assembly includes one or more beam type ejector tools made of a durable metal, such as steel, which have a rounded surface to eliminate point stress on the brittle chip, apertures in the dome which supply vacuum hold down, and through which the eject tools emerge, and a variable rate motor. The radius of the rounded surface is preferably about 100 microns. The ejector tools are similar in shape to the chip, and have a predefined ratio of chip to ejector tool size. In applications wherein more than one ejector tool is included, the ejectors may be arrayed in parallel or in a shape, as dictated by the chip shape, such as square or rectangular.

The ejector assembly has multiple advantages to manufacturing facilities including ease of fabrication, ease of set-up, low maintenance, and that it is readily adapted to existing chip mount equipment without changes to software or sensors.

For a more complete understanding of the present invention, and the advantages thereof, reference is made to the following description taken in connection with the accompanying drawings.

BRIEF DESCRIPTION OF THE DRAWINGS

FIG. 3b is a view of the short axis of the ejector tool assembly as shown in FIG. 3a.

FIG. 4 is a detailed view of the rounded top of an embodiment beam type ejector.

FIG. 5a demonstrates the uniformly distributed load of an embodiment beam ejector tool.

FIG. 5b shows the point pressure of prior art needle ejectors on a chip backside.

FIG. 6 is a top view of the dome with vacuum openings for an embodiment ejector assembly having a single ejector tool.

DETAILED DESCRIPTION OF THE INVENTION

Figure 3A:
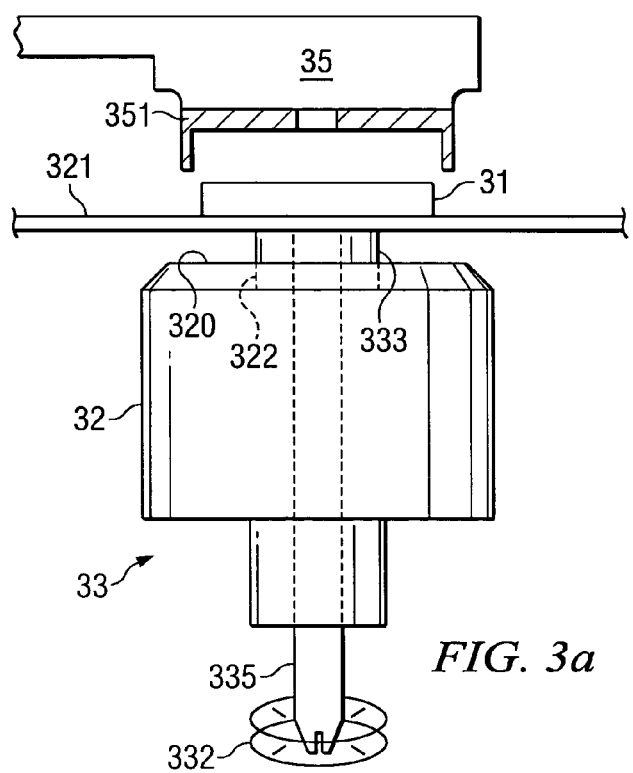
FIG. 3a is a view of the long axis of a beam type ejector tool assembly of an embodiment of the invention.

A process whereby selected semiconductor chips can be removed from a transport tape without damage to either the chips or the tape is facilitated by use of one or more motor driven, rigid, horizontal beam ejector tools aligned to and pressing against the tape and chip backside. FIG. 3a provides a view of an ejector assembly 33 wherein the chip 31 is centered atop an opening 322 in dome surface 320. The longer side of a beam type ejector tool 333 is vertically pressed against a handling tape 321 on which chip 31 is adhered. It can be seen that the rigid, rectangular shaped ejector tool 333 is centered about the length of the chip. In the preferred embodiment, the tool length is approximately 75% of the chip length, thereby allowing in the range of 10% to 15% of the chip length to extend beyond each end of the tool. The chip is removed vertically from the tape, without damage to adjacent chips, by a vacuum tip 351 attached to an arm 35.

Figure 1:
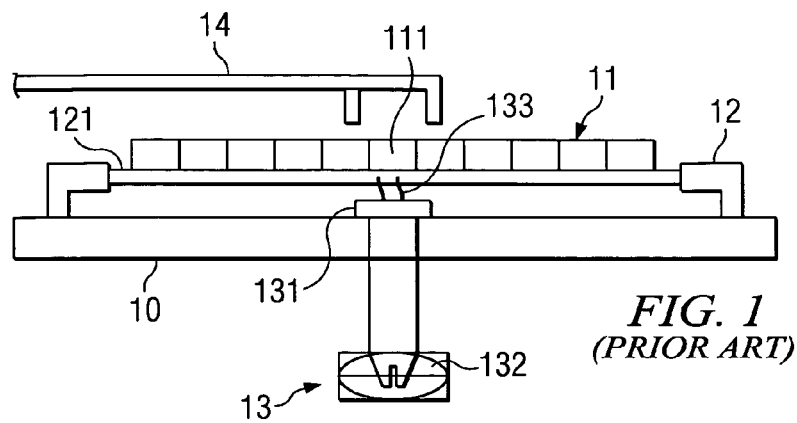
FIG. 1 is a cross sectional view of a prior art ejector assembly for chip mount equipment.
Figure 2:
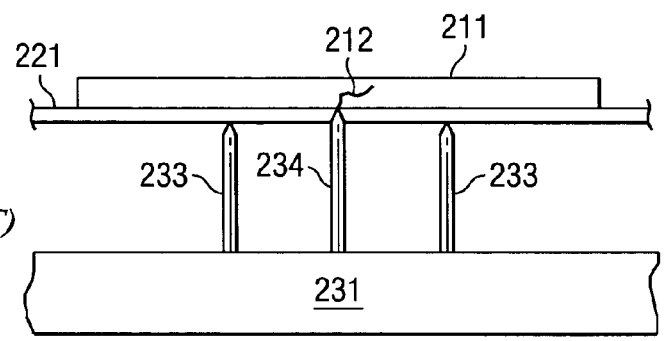
FIG. 2 illustrates prior art multiple ejector needles of non-uniform height along with a cracked chip.

FIG. 3b shows an end view of the ejector tool assembly 33 of FIG. 3a and high aspect ratio chip 311. It can be seen that the tool is fabricated with a rounded top surface 334 which can be contrasted with the sharp needle pins of previous ejector systems as shown in FIG. 2. The rounded top 334 of the beam type ejector 333 reduces localized stresses on the chip backside, and lessens the danger of puncturing the tape 321. For displacement of a very high aspect ratio chip by a single ejector tool, the tool is preferably in the range of 50% to 90% of the chip width, and has a length that is preferably 75% or more of the chip length.

The shorter axis of the ejector tool, shown in greater detail in FIG. 4, includes sloped sides 436 having an approximately 10 to 15 degree angle from the base 437, and converging to form the rounded top of about 100 microns radius.

The embodiment beam ejector tools are preferably formed from a strong, durable material, preferably steel, in order to allow thousands of chip removals without requiring maintenance or replacement.

Referring again to FIGS. 3a and 3b, a variable rate motor 332 drives the shaft 335 and in turn forces the ejector tool 333 through its aperture in the dome 32, and against the tape 321 and chip 31 backside in a smooth motion. As a result of the large area and uniform pressure of a rigid beam 333 against the chip 31, the eject tool 333 needs only to extend slightly above the adjacent chips, or typically about 0.5 mm, for the selected chip to be readily removed by a vacuum pick-up arm 35.

By coupling the controlled speed with uniform pressure, defects to the brittle semiconductor chip are avoided. The bar 56 in FIG. 5a illustrates the evenly distributed load on the backside of a chip 51 from pressure of a solid beam, versus the point load of prior art ejector pins depicted as arrows 57 in FIG. 5b.

FIG. 6 illustrates vacuum apertures 601 and 602 in the surface of ejector assembly dome 620. As shown in FIGS. 3a and 3b, the dome surface 320 is essentially a cylindrical structure having beveled sides. Aperture 601 through which the ejector tool emerges is slightly larger than the tool itself and conforms to the tool shape. In addition to the ejector tool aperture 601, a series of openings 602 in concentric ring depressions 603 are arrayed across the dome surface. Vacuum is supplied to each of the openings 601 and 602 to hold the tape and chips securely. Vacuum suction through the relatively large aperture 601 facilitates aligning and securing the chip until the tool is raised and vacuum is released. The large aperture 601 provides improved alignment and vacuum clamping of the chip, which in turn allows the chip to be removed vertically, without tilt, by the pick up arm. Planar, vertical ejection prevents the chip from contacting and damaging adjacent chips, and from being poorly placed on the pad of an interconnect system, such as a package substrate. It is important that chips be aligned correctly on the interconnect pad in order to avoid misplaced wire bonds and production slow downs. In particular, correct placement of high aspect ratio devices on very narrow pads is important to avoid both stresses on the chip and wire bond failures.

Figure 7:
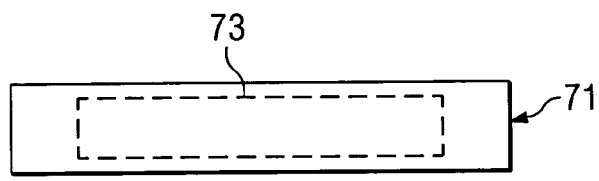
FIG. 7 compares the approximate shape and size of an embodiment beam ejector tool to that of a very high aspect ratio chip.

FIG. 7 illustrates the shape and size of a high aspect ratio chip 71 having a 7:1 length to width ratio as compared to an embodiment ejector beam 73. In this embodiment, the ratio of beam width to chip width is in the range of between 0.9:1.0 to 0.5:1.0, and the ratio of beam length to chip length is in the range of between 0.65:1.0 and 0.85:1.0. The beam dimensions are smaller than those of the chip so as to avoid disturbing or contacting adjacent chips during the ejection and removal process.

Figure 8:
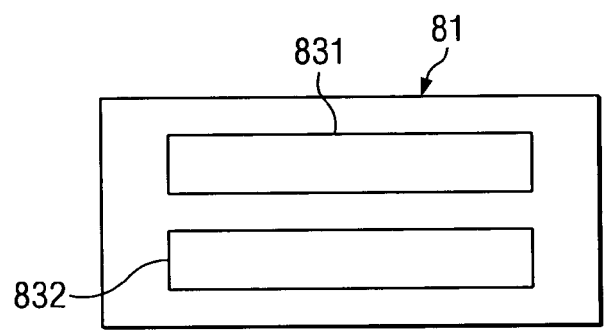
FIG. 8 illustrates a parallel array of embodiment ejector tools and a rectangular chip.

FIG. 8 illustrates an embodiment including multiple beam type ejector tools 83 for rectangular chip 81. Parallel beams 831 and 832 preferably have the same length aspect ratio to the chip as those defined previously, i.e., about 0.75 to 1.0. It is preferable that 25% or less of the chip width extends beyond the outer edges of the beam ejector tool 831 and 832.

In alternative embodiments, as chip width increases, or the length to width aspect ratio decreases, the number of parallel beams may be increased while maintaining the design guidelines provided previously.

Figure 9:
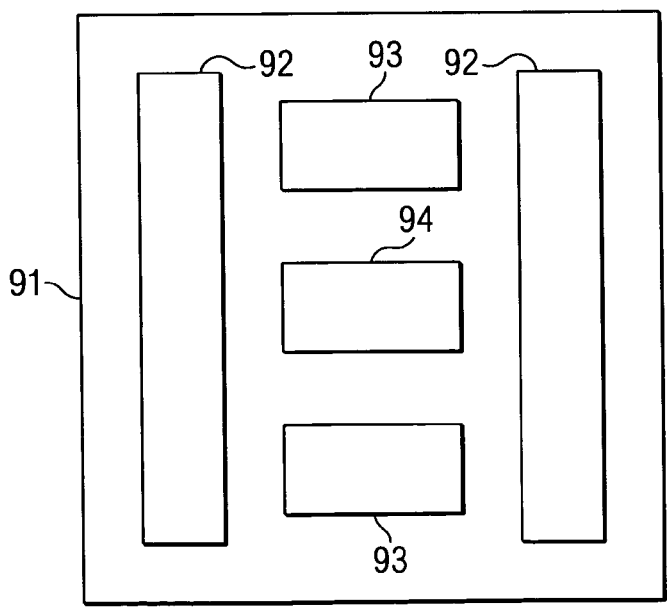
FIG. 9 illustrates a top view of an embodiment array of ejector tools for large chip removal.

Large square chips also present a number of challenges for the chip pick and place process. In prior art approaches, multiple pins arrayed across the ejector assembly dome have been used to displace the chip, but again difficulties arise in setting the needle heights uniformly, in tape contamination on the chip, and in multiple stress related defects. In another embodiment of the invention, shown in FIG. 9, an array of beam type ejector tools includes a pair of parallel ejector tools 92 on the first side of the chip 91 and two or more shorter ejectors 93 and 94 placed orthogonally to and between the ejectors 92. Chip 91 preferably extends beyond the outermost edges of the ejector tools 92, 93, and 94 by less than about 25% of the relevant chip dimension. The center ejector tool 94 is not necessary for smaller square chips, but for very large chips, for example those in excess of 15 mm per side, a center support is preferred.

In each ejector tool embodiment, matching apertures are fabricated in the dome to allow the tools to emerge unobstructed, and to provide an opening for good vacuum suction to be applied to the chip prior to ejection.

Beam type ejector tools and a support dome having apertures matched to the ejectors may be readily adapted to existing chip mount equipment, and no modification to software or sensors is required. Technician set-up time for a beam style ejector assembly is greatly reduced and simplified as compared to existing pin style ejectors. Further, repair and maintenance of the steel beams is minimal, whereas heretofore, damaged and mis-aligned tips of fragile pins were common.

Fabrication of beam ejector tools is simple by comparison with multiple needle ejectors because the beams are machined to readily manufacturable planarity. Good planarity is a requirement for successful removal of high aspect ratio chips, however, tooling tolerance of multi-needle ejectors of the prior art may not meet the desired planarity for very high aspect ratio chips.

It will be recognized that the embodiment ejector tools are applicable to many chip sizes and shapes, and to any chip mount equipment systems, and that modifications and variations will become apparent to those skilled in the art. It is therefore intended that the appended claims be interpreted as broadly as possible in view of the prior art.

What is claimed is:

1. A process for removing a selected semiconductor chip from a handling tape, comprising the steps of:
   providing an ejector assembly including one or more horizontal beam type ejectors and a rigid support surface having a plurality of apertures;
   aligning a selected chip over said one or more ejectors;
   applying vacuum through one or more of said apertures to secure the tape and chip to said support surface; and
   moving said one or more ejectors through said apertures against said tape and chip.

2. The process of claim 1 wherein said step of moving said ejectors displaces said chip to a height greater than adjacent chips on the wafer prior to removal.

3. The process of claim 1 wherein each of said ejector tools comprises a rigid rectangular beam having a rounded top surface of 100 microns or greater in radius.

4. The process of claim 1 wherein said ejector tool comprises steel.

5. The process of claim 1 wherein said step of applying vacuum includes applying vacuum through said apertures through which said ejectors move.

6. The process of claim 1 wherein 25% or less of said chip extends beyond said one or more ejector tools.

7. The process of claim 1 wherein said step of moving is performed by a variable speed motor coupled to said one or more ejectors.

8. The process of claim 1 further comprising the step of lifting said chip from said handling tape using a vacuum pick-up tip.

9. The process of claim 1 wherein said chip is a high aspect ratio chip having a length to width ratio equal to or greater than 4:1.

10. The process of claim 1 wherein said step of providing said ejector assembly comprises providing a single ejector tool having a ratio of length to that of the chip in the range of between 0.65 to 1.0 and 0.85 to 1.0.

11. The process of claim 1 wherein said step of providing an ejector assembly comprises providing a plurality of ejector tools sized to fit within the perimeter of said chip.

12. The process of claim 11 wherein said plurality of ejector tools conforms to the shape of said chip.

13. A process for removing a selected semiconductor chip from a handling tape, comprising the steps of:
   providing an ejector assembly including one or more horizontal beam type ejectors and a rigid support surface having a plurality of apertures;
   aligning a selected chip over said one or more ejectors;
   applying vacuum through one or more of said apertures to secure the tape and chip to said support surface;
   activating a motor connected to a shaft to move said one or more ejectors through said apertures against said tape and chip, and
   removing said chip by a pick-up tip.

* * * * *